(12) United States Patent
Yokozeki

(10) Patent No.: US 9,276,122 B2
(45) Date of Patent: Mar. 1, 2016

(54) THIN-FILM TRANSISTOR, DISPLAY APPARATUS AND ELECTRONIC APPARATUS

(75) Inventor: Mikihiro Yokozeki, Kanagawa (JP)

(73) Assignee: JOLED INC., Tokyo (JP)

( * ) Notice: Subject to any disclaimer, the term of this patent is extended or adjusted under 35 U.S.C. 154(b) by 238 days.

(21) Appl. No.: 13/358,152

(22) Filed: Jan. 25, 2012

(65) Prior Publication Data

US 2012/0205648 A1    Aug. 16, 2012

(30) Foreign Application Priority Data

Feb. 10, 2011  (JP) .................. 2011-027293

(51) Int. Cl.
  *H01L 29/24*   (2006.01)
  *H01L 29/786*  (2006.01)

(52) U.S. Cl.
  CPC ...... *H01L 29/7869* (2013.01); *H01L 29/78696* (2013.01)

(58) Field of Classification Search
  CPC ..................... H01L 29/7869; H01L 29/66742; H01L 21/02565
  USPC .................. 257/43, E29.1, E29.273, E29.003
  See application file for complete search history.

(56) References Cited

U.S. PATENT DOCUMENTS

| | | | |
|---|---|---|---|
| 2004/0012742 A1* | 1/2004 | Ohnishi ................. | 349/123 |
| 2008/0032106 A1* | 2/2008 | Nakayama et al. ........... | 428/216 |
| 2010/0123130 A1* | 5/2010 | Akimoto et al. ............. | 257/43 |
| 2010/0295042 A1* | 11/2010 | Yano et al. .................. | 257/43 |
| 2011/0121289 A1* | 5/2011 | Miyanaga et al. ............ | 257/43 |

FOREIGN PATENT DOCUMENTS

| | | |
|---|---|---|
| JP | 2008-311342 | 12/2008 |
| JP | 2009-231664 | 10/2009 |

* cited by examiner

*Primary Examiner* — David Vu
*Assistant Examiner* — Jonathan Han
(74) *Attorney, Agent, or Firm* — Dentons US LLP

(57) ABSTRACT

Disclosed herein is a thin-film transistor having a gate electrode; a source electrode and a drain electrode which form a source/drain-electrode pair; and a channel layer which is provided between the gate electrode and the source/drain-electrode pair, includes a poly-crystal oxide semiconductor material and has a film thickness smaller than the average diameter of crystal grains of the poly-crystal oxide semiconductor material.

9 Claims, 11 Drawing Sheets

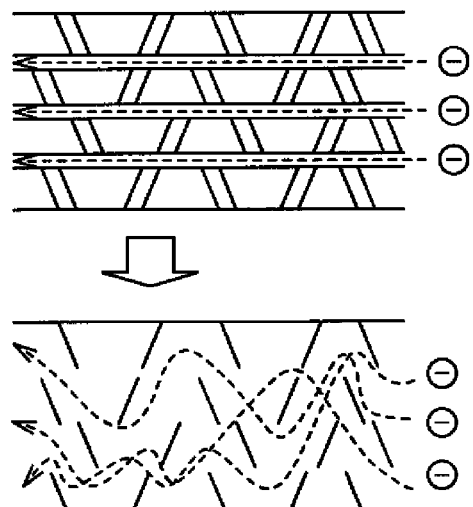
FIG.7A
FIG.7B
FIG.8
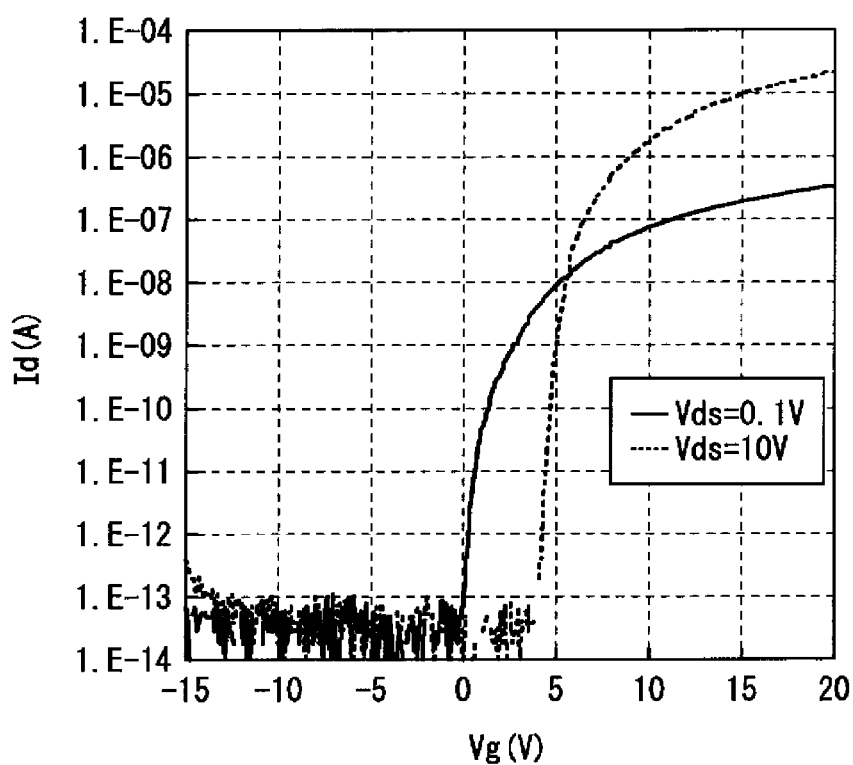

FIG.10
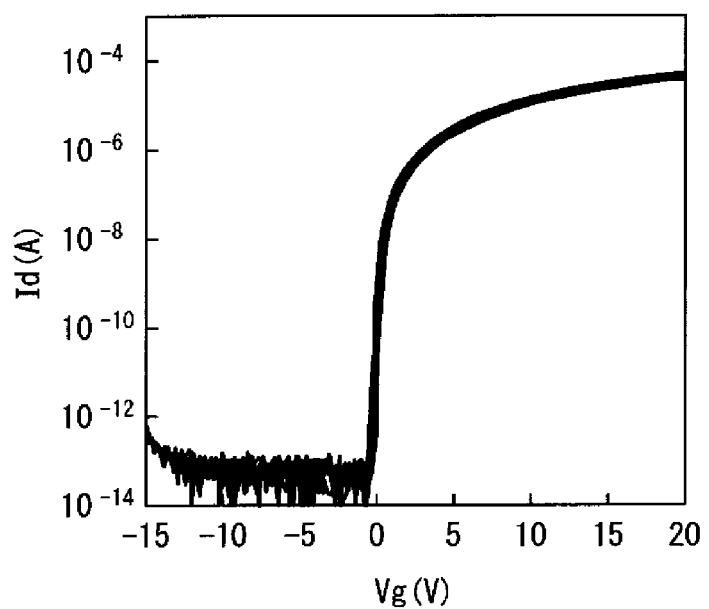
FIG.11
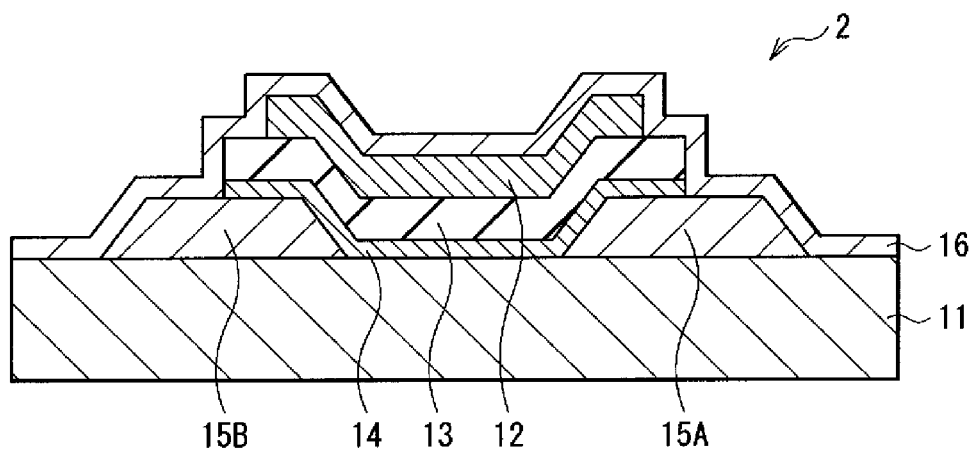

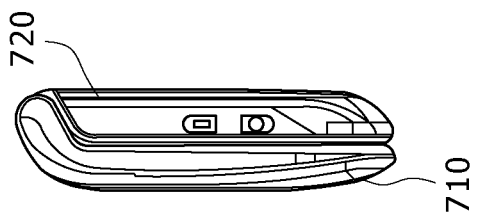
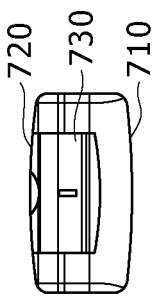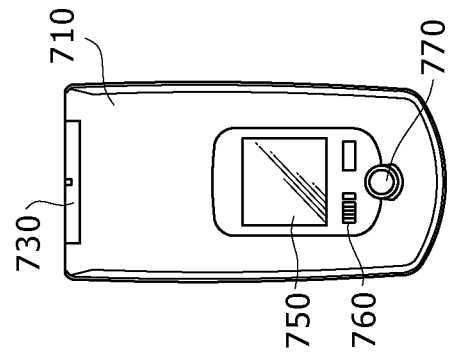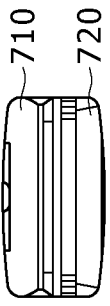
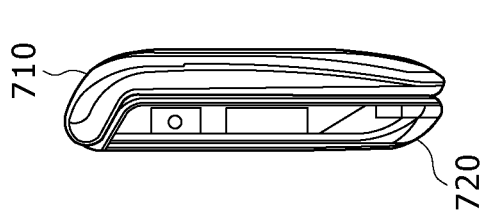
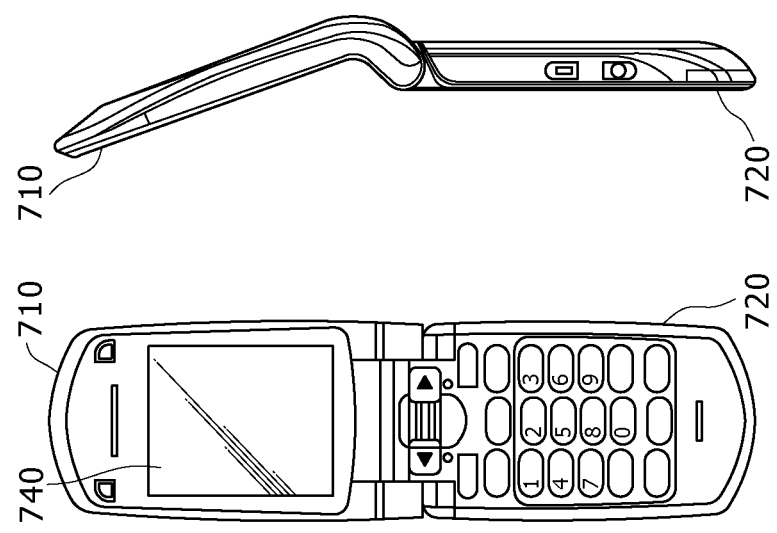

THIN-FILM TRANSISTOR, DISPLAY APPARATUS AND ELECTRONIC APPARATUS

BACKGROUND

The present disclosure relates to a thin-film transistor making use of a poly-crystal oxide semiconductor in the channel layer thereof, a display apparatus including the thin-film transistor and an electronic apparatus employing the display apparatus.

In recent years, display apparatus are designed to have large sizes and high frame rates. In addition, with development of a 3D display apparatus, it is absolutely necessary to add functions to a display device as well as its peripheral devices and to improve the performances of these devices. At the present day, amorphous silicon hydride (a-Si:H) is used to obtain a TFT (Thin-Film Transistor) offering more stability than a TFT which makes use of a covalent semiconductor such as silicon (Si) or gallium arsenide (GaAs). Since amorphous silicon hydride (a-Si:H) can be deposited at low temperatures, amorphous silicon hydride (a-Si:H) satisfies cost and process-temperature restrictions. However, amorphous silicon hydride (a-Si:H) has a low-mobility shortcoming. That is, field-effect mobility <2 $cm^2$/Vs. For this reason, there has been aggressively developed a next-generation TFT material which has a high mobility and is proper for large-area applications.

Among such TFT materials, there is a promising TFT material referred to as an AOS (amorphous oxide semiconductor) which draws much attention. The AOS can be made by making use of all but the same process facilities as the amorphous silicon hydride (a-Si:H). That is to say, the AOS can also be deposited at low temperatures. In addition, since processes such as a laser annealing treatment are not required, the AOS can be produced at a low cost and is proper for large-area applications. On the top of that, the mobility of the AOS can be increased to about 10 $cm^2$/Vs. At the present day, a 37-inch LCD (Liquid-Crystal Display) apparatus and a 12-inch OELD (Organic Electro Luminescence Display) apparatus which are both provided with TFTs made from the AOS are reported to be still at a stage of development.

In order to put the TFT made from the AOS to practical use, however, it is absolutely necessary to improve the reliability of the TFT. In the AOS, a bond between a metal atom and an oxygen atom is instable. Thus, the oxygen atom can be detached from the bond with ease. A typical example of the bond between a metal atom and an oxygen atom is an In—O bond. Thus, there are raised problems that high-concentration carriers uncontrollable due to the loss of the oxygen are introduced with ease and that the characteristics of the AOS change with ease. A typical change of the characteristics of the AOS is a shift of the threshold voltage Vth.

In order to solve these problems, there are provided some techniques. As a technique for solving these problems, an annealing treatment is carried out after a film creation process. By carrying out an annealing treatment after a film creation process, the number of instable metal-oxygen bonds can be reduced. As another technique for solving these problems, a protection layer is created on a channel layer made from the AOS. By creating a protection layer on a channel layer made from the AOS, it possible to prevent the oxygen from departing from the bonds. However, it is difficult to completely eliminate the changes of the characteristics. Thus, it is deemed to be absolutely necessary to substantially eliminate instable bonds between metal and oxygen atoms.

At the same time, there has been reported development of a poly-crystal oxide semiconductor making use of elements of the III and V groups such as InZnO or $In_2O_3$. For more information on this development, the reader is advised to refer to documents such as Japanese Patent Laid-open No. 2008-311342. In the known semiconductor of the III-V groups, a bond is created on an $sp^3$ mixture locus. Thus, the known semiconductor raises a problem that large variations of the carrier transport characteristic and the like are generated if a crystal grain boundary exists. In the case of a poly-crystal oxide semiconductor, on the other hand, the conductivity of carriers is determined by a 5s locus. Thus, there are only few effects caused by the grain boundary as effects of carrier scattering and the like. In addition, the poly-crystal oxide semiconductor has merits that the mobility of carriers is higher than that of the AOS and that the oxygen loss which becomes a problem of the AOS is hardly incurred. The oxygen loss is hardly incurred because a 4-coordinate bond is created between a metal atom and an oxygen atom in a process of crystallization. A typical example of the 4-coordinate bond between a metal atom and an oxygen atom is an In—O bond.

SUMMARY

However, a poly-crystal oxide semiconductor raises a problem that the poly-crystal oxide semiconductor exhibits large variations caused by a crystal grain boundary as variations of the device characteristic. To put it concretely, in a portion of a grain boundary, the propagation of a carrier is blocked. Thus, the carrier moves by avoiding the grain boundary. As a result, the path of the propagation of the carrier becomes instable so that there are variations of the transport characteristic of the carrier and a hysteresis phenomenon occurs.

In order to solve the problem described above, for example, there has been provided a method described in Japanese Patent Laid-open No. 2009-231664 to serve as a method adopted for reducing the number of crystal grain boundaries. In accordance with this method, the film-creation temperature is raised in order to take the state of crystals forming a poly-crystal oxide semiconductor to a state close to that of a single crystal. In the case of a large-size application and an application of making use of a glass substrate, however, it is necessary to reduce the annealing-treatment temperature to a temperature not higher than an allowable maximum temperature of 350 degrees Celsius. Thus, the process of approaching a single crystal is not sufficient. As a result, it is difficult to eliminate the variations of the device characteristic.

It is thus an aim of the present disclosure addressing the problems described above to provide a thin-film transistor made from a poly-crystal oxide semiconductor which has a high mobility of carriers and is capable of reducing the number of variations of the device characteristic and provide a display apparatus including the thin-film transistor as well as an electronic apparatus employing the display apparatus.

A thin-film transistor provided by the embodiment of the present disclosure includes:

a gate electrode;

a source electrode and a drain electrode which form a source/drain-electrode pair; and a channel layer which is provided between the gate electrode and the source/drain-electrode pair, includes a poly-crystal oxide semiconductor material and has a film thickness smaller than the average diameter of crystal grains of the poly-crystal oxide semiconductor material.

A display apparatus provided by the embodiment of the present disclosure includes a display device and the thin-film transistor provided by the embodiment of the present disclosure to serve as a transistor for driving the display device.

An electronic apparatus provided by the embodiment of the present disclosure includes the display apparatus provided by the embodiment of the present disclosure to serve as an apparatus including the display device and the thin-film transistor which is provided by the embodiment of the present disclosure to serve as a transistor for driving the display device.

Since the thin-film transistor provided by the embodiment of the present disclosure includes a channel layer which includes a poly-crystal oxide semiconductor material and has a film thickness smaller than the average diameter of crystal grains composing the poly-crystal oxide semiconductor material, the direction of the carrier propagation can be controlled.

The thin-film transistor provided by the embodiment of the present disclosure includes a channel layer which is provided between the gate electrode and the source/drain-electrode pair, is created by making use of a poly-crystal oxide semiconductor material and has a film thickness smaller than the average diameter of crystal grains of the poly-crystal oxide semiconductor material. Thus, the direction of the carrier propagation can be controlled. As a result, the propagation path of the carriers can be made stable and it is possible to reduce the number of variations of the device characteristic while maintaining the mobility of the carriers. Accordingly, it is possible to improve the performance of a display apparatus employing the thin-film transistor including a channel layer created by making use of a poly-crystal oxide semiconductor material and the performance of an electronic apparatus employing the display apparatus.

BRIEF DESCRIPTION OF THE DRAWINGS

FIGS. 7A and 7B are a plurality of diagrams showing the known poly-crystal oxide semiconductor;

FIG. 8 is a diagram showing characteristics of a typical known thin-film transistor;

FIG. 10 is a diagram showing characteristics of the thin-film transistor shown in FIG. 1;

FIG. 11 is a diagram showing a model of a cross-sectional structure of a thin-film transistor according to a modified version of the embodiment of the present disclosure;

FIG. 19A is a diagram showing the front view the opened state of a fifth typical electronic apparatus to which the display apparatus shown in FIG. 12 is applied; FIG. 19B is a diagram showing the side view of the opened state of the fifth typical electronic apparatus; FIG. 19C is a diagram showing the front view of the closed state of the fifth typical electronic apparatus; FIG. 19D is a diagram showing the left-side view of the closed state of the fifth typical electronic apparatus; FIG. 19E is a diagram showing the right-side view of the closed state of the fifth typical electronic apparatus; FIG. 19F is a diagram showing the top view of the closed state of the fifth typical electronic apparatus; and FIG. 19G is a diagram showing the bottom view of the closed state of the fifth typical electronic apparatus.

DETAILED DESCRIPTION OF THE PREFERRED EMBODIMENTS

In the following description, implementations of the present disclosure are explained in detail by referring to the diagrams. It is to be noted the description is divided into topics arranged in the following order:
1: Embodiment (Bottom-Gate TFT)
2: Modified Version (Top-Gate TFT)
3: Typical Applications (Display Apparatus and Electronic Apparatuses)
Embodiment
Configuration of the Thin-Film Transistor 1

Figure 1:
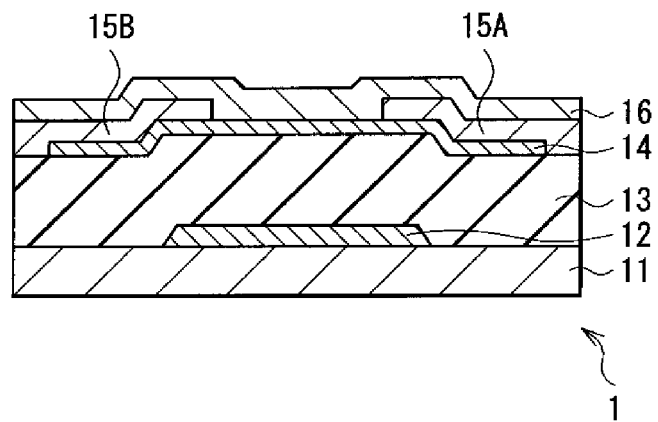
FIG. 1 is a diagram showing a model of a cross-sectional structure of a thin-film transistor according to an embodiment of the present disclosure.

FIG. 1 is a diagram showing a model of a cross-sectional structure of a thin-film transistor 1 according to an embodiment of the present disclosure. The thin-film transistor 1 is a TFT of the so-called bottom-gate type or a TFT having the so-called reversed-stagger structure. The thin-film transistor 1 includes a channel layer 14 made from a poly-crystal oxide semiconductor. On a substrate 11 included in the thin-film transistor 1, a gate electrode 12, a gate insulation film 13, the channel layer 14 and a source electrode 15A/a drain electrode 15B are created in the order the gate electrode 12, the gate insulation film 13, the channel layer 14 and the source electrode 15A/the drain electrode 15B are enumerated in this sentence. The substrate 11 is a substrate made from glass or the like. On the source electrode 15A and the drain electrode 15B, a protection film 16 is created all over the substrate 11.

The gate electrode 12 of the thin-film transistor 1 is an electrode playing a role to control the density of carriers in the channel layer 14 in accordance with a voltage applied to the gate electrode 12 to serve as a gate voltage. To be more specific, the density of carriers in the channel layer 14 is the density of electrons in the channel layer 14. The gate electrode 12 is configured as a single-layer film or a stacked-layer film. The single-layer film is a film made of 1 type of layer such as Mo (molybdenum), Al (aluminum), an aluminum alloy or the like. On the other hand, the stacked-layer film is a film made of two or more such types of layer which are selected from Mo (molybdenum), Al (aluminum), an aluminum alloy or the like. It is to be noted that an aluminum-neodymium alloy can be used as the aluminum alloy.

The gate insulation film 13 is a film covering the gate electrode 12. Typically, the gate insulation film 13 is created all over the substrate 11 to cover the gate electrode 12. The material used for making the gate insulation film 13 is an insulation material including typically silicon. To put it more concretely, the gate insulation film 13 can be a silicon-oxide film, a silicon-nitride film, a silicon-nitride-oxide film or the like. The thickness of the gate insulation film 13 is typically a value in a range of 200 nm to 300 nm.

The channel layer 14 is a layer creating a channel between the source electrode 15A and the drain electrode 15B due to application of the gate voltage to the gate electrode 12. A typical example of a material used for making the channel layer 14 is an $In_2O_3$-group oxide semiconductor. To put it more concretely, typical examples of the material used for making the channel layer 14 include $In_2O_3$ and an oxide semiconductor $In_2O_3$:X which is made by doping $In_2O_3$ with additive impurities X. The impurities X can be typically Ti (titan), Al (aluminum), Ga (gallium), Zn (zinc), Mo (molybdenum), Sn (stannum), a lanthanoid element or the like. In addition, it is also possible to make use of a material of a Bixbyite structure which has the same crystal structure as $In_2O_3$:X. The reader is also advised to keep in mind that it is also possible to make use of either of a ZnO-group oxide semiconductor and an SnO-group oxide semiconductor which both have crystal structures different from that of $In_2O_3$:X.

The $In_2O_3$-group oxide semiconductor has a relatively high mobility of carriers in comparison with the other poly-crystal oxide semiconductors. In particular, the film of the (222) face is created so that the (222) face is oriented in a direction parallel to the substrate 11 in order to obtain the high mobility of carriers.

Figure 2A:
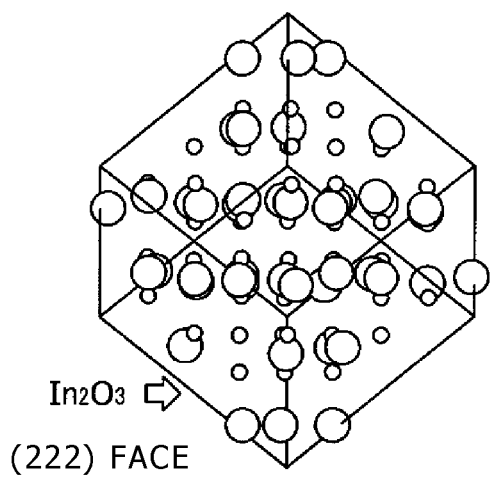
FIGS. 2A and 2B are a plurality of diagrams showing a model of a crystal structure of a poly-crystal oxide semiconductor.
Figure 2B:
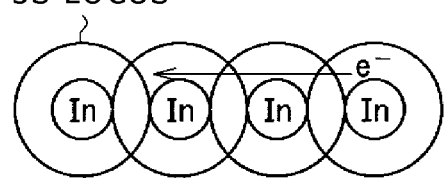

FIG. 2A is a diagram showing the crystal structure of the (222) face of $In_2O_3$. It is obvious that an In face is created on the (222) face. As shown in the figure, in the crystal structure of the $In_2O_3$-group oxide semiconductor, the adjacent-In distance is short so that, as shown in FIG. 2B, the 5s loci of In overlap each other. The large magnitude of the mobility of carriers in the $In_2O_3$-group oxide semiconductor is considered to be caused by the fact that the mutually overlapping 5s loci form a propagation path of the carriers. That is to say, by creating the film of the (222) face so as to orient the (222) face in a direction parallel to the substrate 11 as described above, the In—In bonds are linked to each other in the direction of the propagation of the carriers so that the highest mobility of the carriers is obtained.

Figure 3:
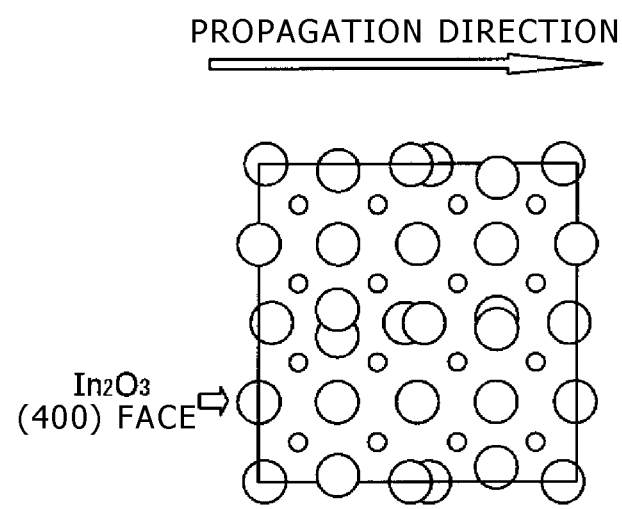
FIG. 3 is a diagram showing a model of another crystal structure of a poly-crystal oxide semiconductor.

FIG. 3 is a diagram showing the crystal structure of the (400) face of the $In_2O_3$-group oxide semiconductor. As shown in FIG. 3, each In is adjacent to other In also on the (400) face. Thus, by creating the film of the (400) face so as to orient the (400) face in a direction parallel to the substrate 11, a high mobility of carriers can also be obtained as is the case with the (222) face.

In addition, it is desirable to reduce the film thickness of the channel layer 14 according to the embodiment to a value not greater than the average diameter of crystal grains of the poly-crystal oxide semiconductor composing the channel layer 14. The diameter of each crystal grain of the poly-crystal oxide semiconductor composing the channel layer 14 is not prescribed in particular. From the practical-use point of view, however, it is desirable to set the diameters of crystal grains of the poly-crystal oxide semiconductor composing the channel layer 14 at values not smaller than a value in a range of 10 nm to 20 nm. For this reason, the actual film thickness of the channel layer 14 is set at a value not greater than 20 nm. Desirably, it is even nicer to set the actual film thickness of the channel layer 14 at a value not greater than 10 nm. By reducing the film thickness of the channel layer 14 according to the embodiment to a value not greater than the average diameter of crystal grains of the poly-crystal oxide semiconductor composing the channel layer 14, the direction of the propagation of carriers moving in the channel layer 14 can be controlled so that the propagation path of the carriers can be made stable.

It is to be noted that, the larger the crystal diameter of the poly-crystal oxide semiconductor, the more desirable the poly-crystal oxide semiconductor. Thus, the crystal diameter of the poly-crystal oxide semiconductor does not have an upper limit. On top of that, in addition to the element described above, it is possible to include an element such as Ga (gallium), Al (aluminum), Ti (titan), Zn (zinc), Sn (stannum), Mo (molybdenum) or a lanthanoid-group element.

Each of the source electrode 15A and the drain electrode 15B is configured as a single-layer film or a stacked-layer film. The single-layer film is a film made of one type of layer such as Mo (molybdenum), Al (aluminum), Cu (copper), Ti (titan), the ITO (Indium Tin Oxide) or a titan oxide. On the other hand, the stacked-layer film is a film made of two or more types of layer which are selected from Mo (molybdenum), Al (aluminum), Cu (copper), Ti (titan), the ITO (Indium Tin Oxide) and a titan oxide. For example, it is desirable to make use of a three-stack layer, a metal or a metal compound. The three layers in the three stacked layers are made from Mo (molybdenum), Al (aluminum) and Mo (molybdenum) respectively. In this case, the Mo (molybdenum), Al (aluminum) and Mo (molybdenum) layers are created in an order the Mo (molybdenum), Al (aluminum) and Mo (molybdenum) layers are enumerated in this sentence. The thicknesses of the three stacked layers are set at typical values of 50 nm, 500 nm and 50 nm respectively. The metal and the metal alloy are respectively a metal and a metal alloy which both have a weak conjuncture with oxygen. A typical example of the metal alloy having a weak conjuncture with oxygen is a metal compound including oxygen. Typical examples of the metal compound including oxygen are the ITO and the titan oxide. Thus, the electrical characteristics of the poly-crystal oxide semiconductor can be sustained in a stable state. Conversely, if each of the source electrode 15A and the drain electrode 15B is configured to compose a metal having a strong conjuncture with oxygen, oxygen is drawn out from the poly-crystal oxide semiconductor to result in an oxygen loss which undesirably worsens the electrical characteristics of the poly-crystal oxide semiconductor. The oxygen is drawn out from the poly-crystal oxide semiconductor because each of the source electrode 15A and the drain electrode 15B is provided at a location in contact with to the poly-crystal oxide semiconductor.

The protection film 16 is configured as a single-layer film or a stacked-layer film. Typical examples of the single-layer film are an aluminum-oxide film and a silicon-oxide film. On the other hand, the stacked-layer film is a film created from an aluminum-oxide film and a silicon-oxide film. It is to be noted that the aluminum-oxide film used for making the protection film 16 is a high-density aluminum-oxide film normally utilized in a thin-film transistor. The thickness of the protection film 16 is typically in a range of 10 nm to 100 nm. It is nice to set the thickness of the protection film 16 at a value not greater than 50 nm. An oxide semiconductor film has a problem that the electrical characteristics of the film change due to, among other causes, mixing of hydrogen and/or absorption of water. By making use of a high-density aluminum oxide film as the protection film 16, however, the excellent gas-barrier property of the high-density aluminum oxide film is capable of preventing the electrical characteristics of the channel layer 14 from changing due to, among other causes, mixing of hydrogen and/or absorption of water. In addition, by making use of a high-density aluminum oxide film as the protection film 16, the protection film 16 can be created without deteriorating the electrical characteristics of the oxide semiconductor.

Method for Manufacturing the Thin-Film Transistor 1

FIGS. 4A to 4D are a plurality of diagrams showing a sequence of processes carried out in accordance with a method for manufacturing the thin-film transistor 1 shown in FIG. 1. For example, the thin-film transistor 1 can be created as follows.

Figure 4A:
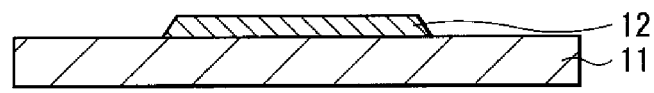
FIGS. 4A to 4D are a plurality of diagrams showing a sequence of processes carried out in accordance with a method for manufacturing the thin-film transistor shown in FIG. 1.

First of all, as shown in FIG. 4A, a metal film such as an Mo film is created to have a typical thickness of 100 nm all over the substrate 11 by adoption of a sputtering technique or an evaporation technique. Then, a patterning process is carried out on the Mo film by adoption of a lithography technique in order to create a gate electrode 12.

Figure 4B:
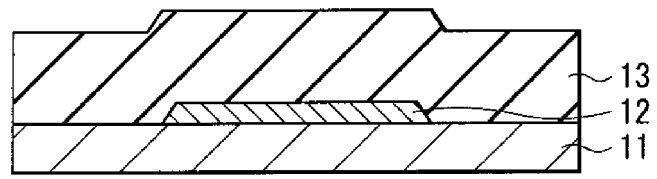

Subsequently, as shown in FIG. 4B, an $SiO_2$ film is created to cover the substrate 11 and the gate electrode 12 as a film having a typical thickness of 300 nm by adoption of a plasma CVD technique or the like in order to form a gate insulation film 13. To put it more concretely, the gate insulation film 13 is created from a $SiO_2$ film by adoption of a plasma CVD technique which makes use of mixed gas including silane and dinitrogen monoxide as raw gas.

Figure 4C:
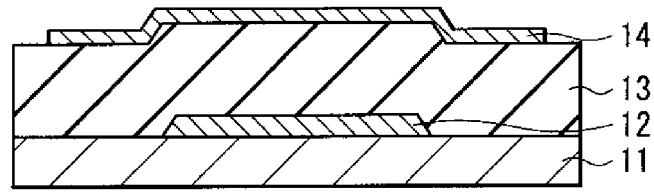
Figure 5:
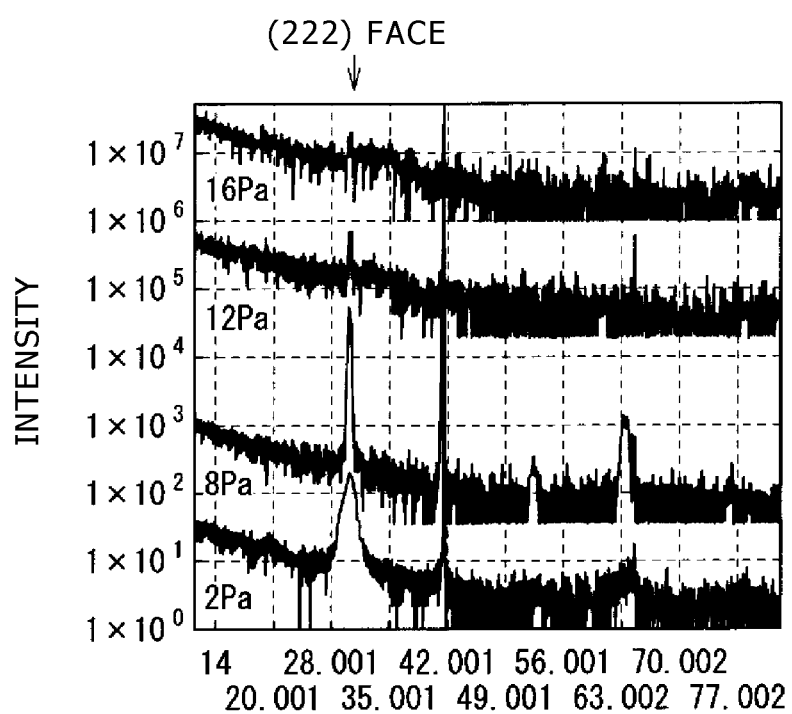
FIG. 5 is a diagram showing XRD spectra of the poly-crystal oxide semiconductor shown in FIGS. 2A and 2B.

Subsequently, as shown in FIG. 4C, a channel layer 14 is created by adoption of a PLD (pulsed laser deposition) technique or the like. To put it more concretely, if indium oxide ($In_2O_3$) is used as the poly-crystal oxide semiconductor, a laser beam is converged and the indium oxide ($In_2O_3$) serving as the target is evaporated to be deposited on the substrate 11. At that time, in a PLD apparatus for example, gas is exhausted from a vacuum container in order to attain a typical degree of vacuum of $1\times10^{-4}$ Pa or lower. Then, oxygen gas is introduced and the pressure of the gas is adjusted to 8 Pa in order to carry out an ablation process. FIG. 5 is a diagram showing XRD (X-ray diffraction) spectrum changes caused by the oxygen pressure as spectrum changes of the $In_2O_3$ single film. In order to control the orientation of the crystal, it is necessary to optimize a film-creation condition. The poly-crystal oxide semiconductor changes the orientation of the crystal in accordance with the oxygen pressure existing at a film-creation time. In general, at a low oxygen pressure, crystallization is easy to occur but orientation variations tend to be generated. At a high oxygen pressure, on the other hand, crystallization is difficult to occur but orientations can be made uniform with ease. As is obvious from FIG. 5, by setting the oxygen pressure at the film-creation time at 8 Pa, $In_2O_3$ has a uniform orientation on the (222) face. That is to say, the (222) face can be made parallel to the substrate 11 in a film-creation process. In addition, the concentration of carriers in the channel can be controlled by adjusting the flow rate of the oxygen gas. It is to be noted that the channel layer 14 can also be created from the poly-crystal oxide semiconductor according to the embodiment in a film-creation process by adoption of a sputtering technique in addition to the PLD technique.

Figure 4D:
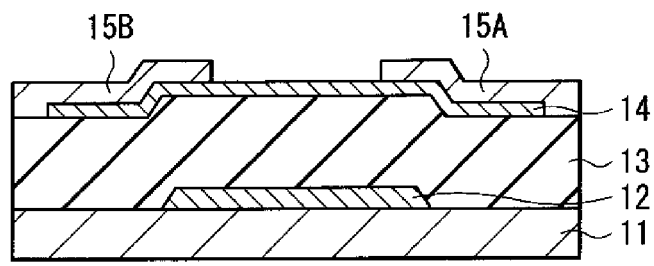

Then, as shown in FIG. 4D, a metal film is created on the channel layer 14 by stacking typically Mo, Al and Mo layers in the order the Mo, Al and Mo layers are enumerated in this sentence in a film-creation process by adoption of a sputtering technique or the like. Later on, by adoption of a wet etching technique making use of mixed liquid including phosphoric acid, nitric acid and acetic acid, a patterning process is carried out on the created metal film. In this way, a source electrode 15A and a drain electrode 15B are created.

Then, on the source electrode 15A and the drain electrode 15B, a protection film 16 such as an $Al_2O_3$ film is created to have a typical thickness of 500 nm by adoption of typically a sputtering technique or an ALD (Atomic Layer Deposition) technique. At the end of the process to create the protection film 16, the thin-film transistor 1 shown in FIG. 1 is completed.

Operations of the Thin-Film Transistor 1 and Effects Thereof

Next, the following description explains operations carried out by the thin-film transistor 1 and effects provided thereby.

In the thin-film transistor 1, when a gate voltage equal to at least a threshold voltage determined in advance is applied to the gate electrode 12 through a wiring layer shown in none of the figures, a channel is created in the channel layer 14. The channel allows a current referred to as a drain current to flow between the source electrode 15A and the drain electrode 15B so that the thin-film transistor 1 functions as a transistor.

A relation between the film thickness of the poly-crystal oxide semiconductor and the mobility of the semiconductor is explained by making use of $In_2O_3$ created under the above conditions including an oxygen pressure of 8 Pa and a laser power of 60 mJ.

Figure 6:
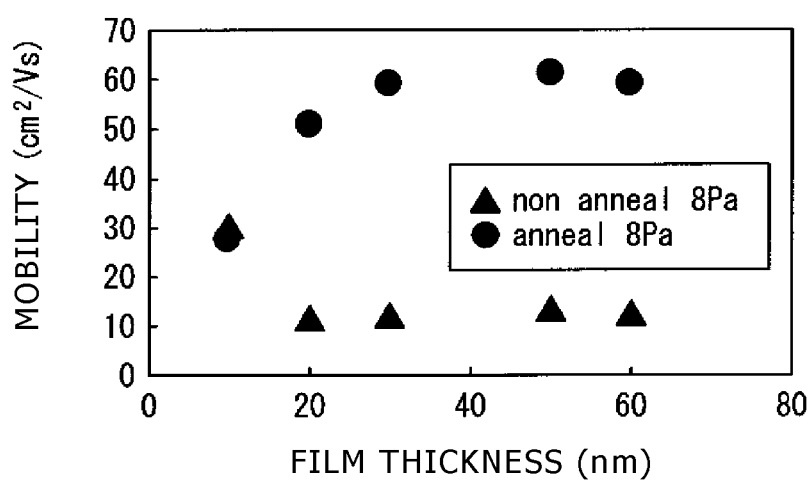
FIG. 6 is a characteristic diagram showing a relation between the film thickness of a poly-crystal oxide semiconductor and the mobility of the poly-crystal oxide semiconductor.

FIG. 6 is a characteristic diagram showing a relation between the film thickness of the poly-crystal oxide semiconductor and the mobility of the semiconductor. To put it in detail, FIG. 6 shows mobility changes measured in a Hall measurement process. The mobility changes are caused by the thickness of the $In_2O_3$ film not subjected to an annealing treatment following the film-creation process and the thickness of the $In_2O_3$ film obtained as a result of the annealing treatment following the film-creation process. For a small film thickness of 10 nm for example, a high mobility of 30 $cm^2/Vs$ is shown without regard to whether or not the annealing process is carried out. In an $In_2O_3$ film not subjected to the annealing treatment, however, the mobility decreases as the film thickness increases. To put it more concretely, at a film thickness of 20 nm, the mobility decreases to 10 $cm^2/Vs$. The mobility of 10 $cm^2/Vs$ is all but equal to the mobility of the In-group amorphous oxide semiconductor. In an $In_2O_3$ film obtained as a result of the annealing treatment, on the other hand, the mobility increases as the film thickness increases. To put it more concretely, the mobility decreases to 60 $cm^2/Vs$ for reasons described as follows.

FIGS. 7A and 7B are a plurality of diagrams showing the known poly-crystal oxide semiconductor. To be more specific, FIG. 7A is a diagram showing a model of the internal structure of an $In_2O_3$ film, which has a large film thickness and has not been subjected to the annealing treatment, as well as propagation paths of carriers in the film. On the other hand, FIG. 7B is a diagram showing a model of the internal structure of an $In_2O_3$ film, which has a large film thickness and has been obtained as a result the annealing treatment, as well as propagation paths of carriers in the film. The $In_2O_3$ film not subjected to the annealing treatment is in a state in which a number of amorphous portions (A in the figure) are left on the crystal grain boundaries. As described before, the oxygen of the amorphous portions is easily lost so that the mobility increases due the loss of the oxygen. Thus, carriers propagate selectively through the amorphous portions which have a carrier concentration higher than that of high-mobility crystal portions (C in the figure). As a result, the mobility becomes approximately equal to the mobility of the amorphous oxide semiconductor. In the $In_2O_3$ film obtained as a result the annealing treatment, on the other hand, the number of amorphous portions existing on the crystal grain boundaries decreases due to the annealing treatment. In addition, the crystal orientability of $In_2O_3$ is improved to reduce the number of crystal grain boundaries. Thus, as shown in FIG. 7B, carriers propagate selectively through crystal portions having a high mobility. In the $In_2O_3$ film obtained as a result of the annealing treatment, the number of crystal portions having a high mobility rises as the film thickness increases. Thus, carriers are capable of propagating through the crystal portions more easily. As a result, the mobility of the carriers is improved.

As is obvious from FIG. 7B, however, carriers propagate by avoiding amorphous portions. Thus, the direction of the propagation is complicated. The complicacy of the propagation direction and the instability of the direction are causes of variations of characteristics in the device. FIG. 8 is a diagram showing Vg-Id characteristics of the known thin-film transistor having a channel layer made from a poly-crystal oxide semiconductor to serve as a layer having a large film thickness. Two curves represent the Vg-Id characteristics for Vds=0.1 V and Vds=10 V respectively. The current Id changes when the voltage Vds is increased from 0.1 V to 10 V. The change of the current Id is considered to be caused by a crystal-grain-boundary change due to the change of the voltage Vds, that is, due to a generated hysteresis.

In the thin-film transistor 1 according to the embodiment, on the other hand, the film thickness of the channel layer 14 making use of the poly-crystal oxide semiconductor is set at a value not greater than the average diameter of the crystal grains of the poly-crystal oxide semiconductor. The following description explains the carrier propagation for a case in which the film thickness of an $In_2O_3$ semiconductor is set at a value smaller than the average diameter of the crystal grains of the semiconductor.

Figure 9A:
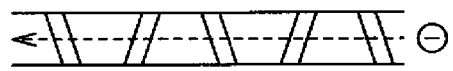
FIGS. 9A and 9B are a plurality of diagrams showing a model of the poly-crystal oxide semiconductor shown in FIGS. 2A and 2B.
Figure 9B:
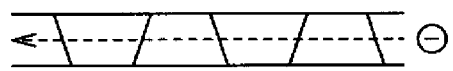

FIGS. 9A and 9B is a plurality of diagrams showing a model of the poly-crystal oxide semiconductor shown in FIGS. 2A and 2B. To be more specific, FIG. 9A is a diagram showing a model of the internal structure of an $In_2O_3$ film, which has been created in accordance with a method for manufacturing the thin-film transistor 1 and has a film thickness set at a value not greater than the average diameter of the crystal grains of the semiconductor, as well as propagation paths of carriers in the film. For example, the $In_2O_3$ film has a thickness of 10 nm. As is obvious from FIG. 9A, since the film thickness is not greater than the average diameter of crystal grains, amorphous portions continuing in the propagation direction do not exist. Thus, unlike the $In_2O_3$ film shown in FIG. 7A as a film which has a large thickness and has not been subjected to an annealing treatment, the propagation path of carriers passes through both amorphous portions and crystal portions. As a result, even if the $In_2O_3$ film is not subjected to an annealing treatment, the mobility of carriers is sustained at a high value unlike an $In_2O_3$ film having a large thickness.

Next, by referring to FIG. 9B, the following description explains the internal structure of the $In_2O_3$ film having a small thickness and the propagation path of carriers in the $In_2O_3$ film for a case in which the $In_2O_3$ film is subjected to a annealing treatment after the $In_2O_3$ film has been created in accordance with a method for manufacturing the thin-film transistor 1. In an $In_2O_3$ film having a small thickness, crystallization of amorphous portions is carried forward by the annealing treatment in the same say as the $In_2O_3$ film having a large thickness. However, reduction of the number of crystal grain boundaries is limited. In particular, even if carried forward in the direction of the c axis, the shift of the crystal axis of rotation components in the surface cannot be recovered with ease. Thus, carriers pass through both amorphous and crystal portions on grain boundaries in the same way as an $In_2O_3$ film not subjected to an annealing treatment. As a result, like the $In_2O_3$ film shown in FIG. 7B as a film resulting from an annealing treatment, the mobility of carriers is not improved. However, the propagation path of the carriers does not become complicated. Accordingly, as shown in FIG. 10, a hysteresis caused by the complicacy of the propagation path is not observed in the Vg-Id characteristic of the thin-film transistor 1 according to the embodiment. That is to say, characteristic variations in the device are improved. It is to be noted that, in the thin-film transistor 1 according to the embodiment, execution of an annealing process after the film-creation process of the $In_2O_3$ film is not questioned in particular. By carrying out an anneal treatment, however, the number of instable In—O bonds can be reduced. It is thus possible to prevent the characteristic of the mobility from changing with the lapse of time due to temperature changes and an oxygen loss.

As described above, in the thin-film transistor 1 according to the embodiment, the channel layer 14 is created from a poly-crystal oxide semiconductor at a location between the gate electrode 12 and the electrode pair which consists of the source electrode 15A and the drain electrode 15B. In addition, the film thickness of the channel layer 14 is set at a value smaller than the average diameter of crystal grains of the poly-crystal oxide semiconductor material. Thus, carriers propagating inside the channel layer 14 are always scattered by electric fields generated by the crystal grains. Since almost all the carriers are scattered by the crystal-grain electric fields the same number of times, however, there are no characteristic variations attributed to the scattering caused by the electric fields. That is to say, it is possible to reduce the number of variations while sustaining the mobility of the carriers.

Modified Version

FIG. 11 is a diagram showing a model of a cross-sectional structure of a thin-film transistor 2 according to a modified version of the present disclosure. The thin-film transistor 2 is a TFT of the so-called top-gate type also referred to as the stagger-structure type. The thin-film transistor 2 also includes a channel layer 14 made from a poly-crystal oxide semiconductor. On a substrate 11 included in the thin-film transistor 2, a source electrode 15A/a drain electrode 15B, the channel layer 14, a gate insulation film 13 and a gate electrode 12 are created in the order the source electrode 15A/the drain electrode 15B, the channel layer 14, the gate insulation film 13 and the gate electrode 12 are enumerated in this sentence. The substrate 11 is a substrate made from glass or the like. On the gate electrode 12, a protection film 16 is created all over the substrate 11.

It is to be noted that, even though the relations of the positions of the configuration elements employed in the thin-film transistor 2 of the top-gate type according to this modified version are different from the relations of the positions of the counterpart configuration elements employed in the thin-film transistor 1 of the bottom-gate type according to the embodiment, each of the configuration elements employed in the thin-film transistor 2 has the same function and the same configuration material as its counterpart configuration element employed in the thin-film transistor 1. Thus, for the sake of convenience, the configuration elements employed in the thin-film transistor 2 are denoted by the same reference numerals as the counterpart configuration elements employed in the thin-film transistor 1. In addition, the configuration elements employed in the thin-film transistor 2 are not explained in the following description in order to avoid duplications of explanations.

In the thin-film transistor 2 according to the modified version, the channel layer 14 is created from a poly-crystal oxide semiconductor and the film thickness of the channel layer 14 is set at a value smaller than the average diameter of crystal grains of the poly-crystal oxide semiconductor. It is thus possible to obtain the same effects as the thin-film transistor 1 of the bottom-gate type according to the embodiment.

Typical Applications

Next, the following description explains display apparatus each employing the TFTs (thin-film transistors), which are provided in accordance with the embodiment and the modified version, and electronic apparatuses each including the display apparatus.

Display Apparatus

Figure 12:
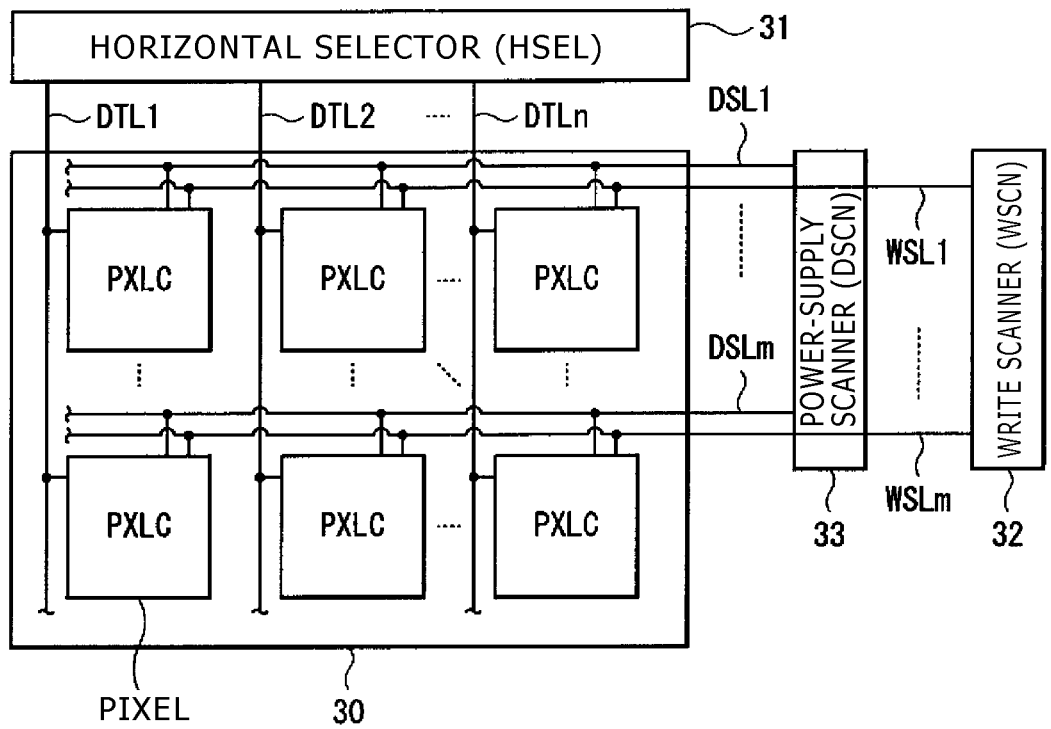
FIG. 12 is a block diagram showing a typical configuration of a display apparatus employing TFTs.

FIG. 12 is a block diagram showing a typical configuration of a display apparatus employing the TFTs described above. The display apparatus is an organic EL display apparatus making use of organic EL devices. The display apparatus typically has a display area 30 created on a TFT substrate corresponding to the substrate 11 described earlier. The display area 30 includes a plurality of pixels PXLC laid out to form a matrix. Each of the pixels PXLC includes an organic electric-field light emitting device also referred to as an organic EL device functioning as a display device. At locations surrounding the display area 30, there are provided a horizontal selector (HSEL) 31, a write scanner (WSCN) 32 and a power-supply scanner (DSCN) 33. The horizontal selector 31, the write scanner 32 and the power-supply scanner 33 function as a signal-line driving circuit, a scan-line driving circuit and a power-supply-line driving circuit respectively.

On the display area 30, there are provided a plurality of signal lines DTL1 to DTLn each oriented in the matrix-column direction, a plurality of scan lines WSL1 to WSLm each oriented in the matrix-row direction and a plurality of power-supply lines DSL1 to DSLm each also oriented in the matrix-row direction. The number of aforementioned signal lines DTL1 to DTLn is n denoting an integer. On the other hand, the number of aforementioned scan lines WSL1 to WSLm and the number of aforementioned power-supply lines DSL1 to DSLm are each m denoting an integer.

In addition, at an intersection of a signal line DTL and a scan line WSL, a pixel PXLC is provided. The pixel PXLC can be a pixel for a R (red), G (green) or B (blue) color. The signal lines DTL1 to DTLn are connected to the horizontal selector 31 which asserts video signals on the signal lines DTL1 to DTLn. By the same token, the scan lines WSL1 to WSLm are connected to the write scanner 32 which asserts select pulses each serving as a scan signal on the scan lines WSL1 to WSLm. In the same way, the power-supply lines DSL1 to DSLm are connected to the power-supply scanner 33 which asserts control pulses each serving as a power-supply signal on the power-lines DSL1 to DSLm.

Figure 13:
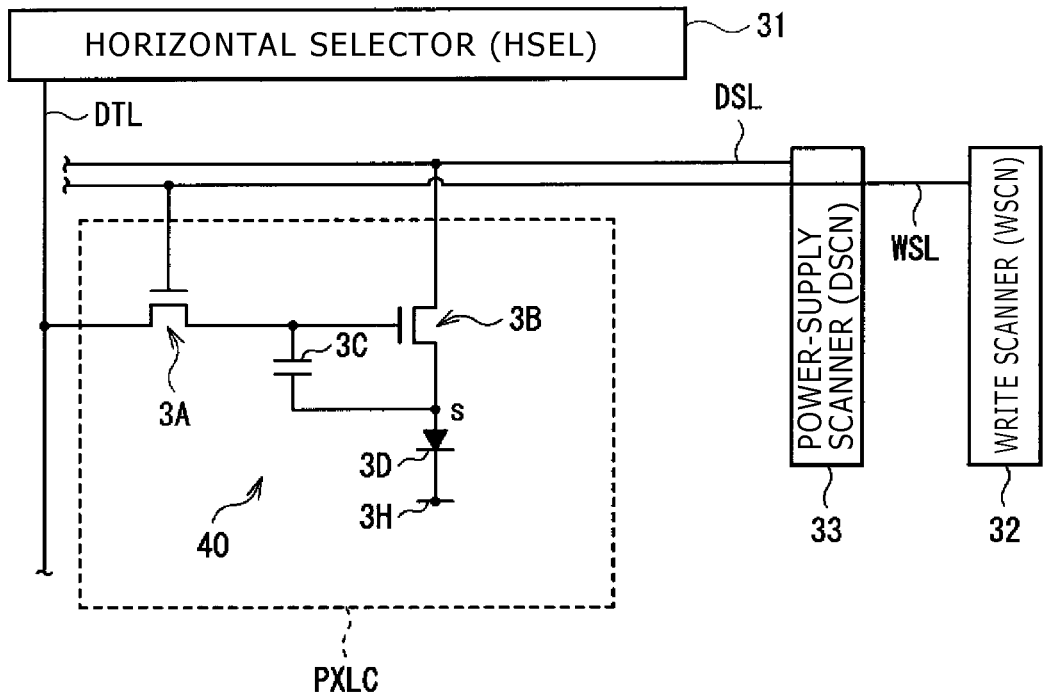
FIG. 13 is a diagram showing a detailed circuit of a pixel employed in the display apparatus shown in FIG. 12.

FIG. 13 is a diagram showing a detailed circuit of the pixel PXLC employed in the display apparatus shown in FIG. 12. Every pixel PXLC has a pixel circuit 40 including an organic EL device 3D. The pixel circuit 40 is an active-type driving circuit employing a sampling transistor 3A, a driving transistor 3B and a storage capacitor 3C in addition to the organic EL device 3D. Each of the sampling transistor 3A and the driving transistor 3B is the thin-film transistor according to the embodiment or the modified version.

The gate electrode of the sampling transistor 3A is connected to a scan line WSL provided for a row on which the pixel PXLC is located. A specific one of the source and drain electrodes of the sampling transistor 3A is connected to a signal line DTL provided for a column on which the pixel PXLC is located. The other one of the source and drain electrodes of the sampling transistor 3A is connected to the gate electrode of the driving transistor 3B.

The drain electrode of the driving transistor 3B is connected to a power-supply line DSL provided for the row on which the pixel PXLC is located. The source electrode of the driving transistor 3B is connected to the anode of the organic EL device 3D. The cathode of the organic EL device 3D is connected to the ground line 3H. It is to be noted that the ground line 3H is connected to all the pixels PXLC as a line common to all the pixels PXLC.

The storage capacitor 3C is connected between the source and gate electrodes of the driving transistor 3B.

A select pulse serving as a scan signal is supplied from the scan line WSL to the gate of the sampling transistor 3A in order to put the sampling transistor 3A in a conductive state in which an electric potential appearing on a video signal supplied by the signal line DTL is sampled and stored in the storage capacitor 3C. The driving transistor 3B receives a current from the power-supply line DSL set at a predetermined first electric potential not shown in the figure. The driving transistor 3B provides the organic EL device 3D with a driving current according to the signal electric potential stored in the storage capacitor 3C as the electric potential of the video signal. Driven by the driving current, the organic EL device 3D emits light at a luminance according to the signal electric potential stored in the storage capacitor 3C as the electric potential of the video signal.

As described above, in the display apparatus, a select pulse serving as a scan signal is supplied from the scan line WSL to the gate of the sampling transistor 3A in order to put the sampling transistor 3A in a conductive state in which an electric potential appearing on a video signal supplied by the signal line DTL is sampled and stored in the storage capacitor 3C. In addition, the driving transistor 3B receives a current from the power-supply line DSL set at a first electric potential determined in advance. Then, the driving transistor 3B provides the organic EL device 3D with a driving current according to the signal electric potential stored in the storage capacitor 3C as the electric potential of the video signal. The organic EL device 3D can be an organic EL device for a red, green or blue color. Driven by the driving current, the organic EL device 3D emits light at a luminance according to the signal electric potential stored in the storage capacitor 3C as the electric potential of the video signal. As a result, an image based on video signals is displayed in the display apparatus.

Electronic Apparatuses

Next, the following description explains typical applications of the display apparatus described above to electronic apparatuses. The display apparatus described above can be applied to electronic apparatuses in all fields. Typical examples of the electronic apparatuses are a TV set, a digital camera, a notebook personal computer, a portable terminal apparatus such as a cellular phone and a video camera. In other words, the display apparatus described above can be applied to electronic apparatuses included in all fields to serve as apparatuses capable of displaying a video signal received from an external source or generated internally in the apparatuses as an image or a moving picture.

Module

Figure 14:
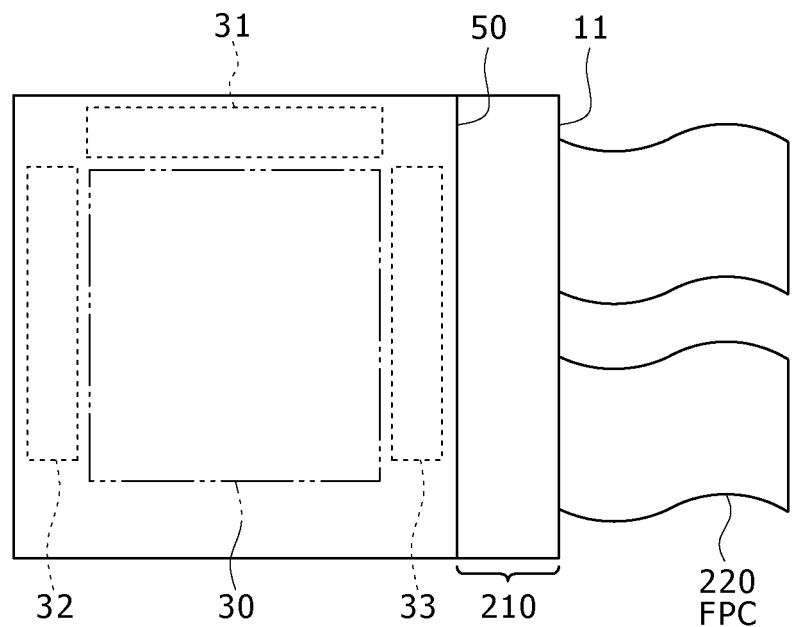
FIG. 14 is a diagram showing the top view of a rough configuration of a module including the display apparatus shown in FIG. 12.

The display apparatus described above is embedded as a module like one shown in FIG. 14 in a variety of electronic apparatuses. Examples of the electronic apparatuses are first to fifth typical electronic apparatuses described below. As shown in the figure, in the module, typically, an area 210 exposed from a sealing substrate is provided on one side of a substrate 11. Wires from a horizontal selector 31, a write scanner 32 and a power-supply scanner 33 are extended to the exposed area 210 in order to form external connection terminals not shown in the figure. An FPC (Flexible Printed Circuit) 220 for inputting and outputting signals may be provided on the external connection terminals.

First Typical Electronic Apparatus

Figure 15:
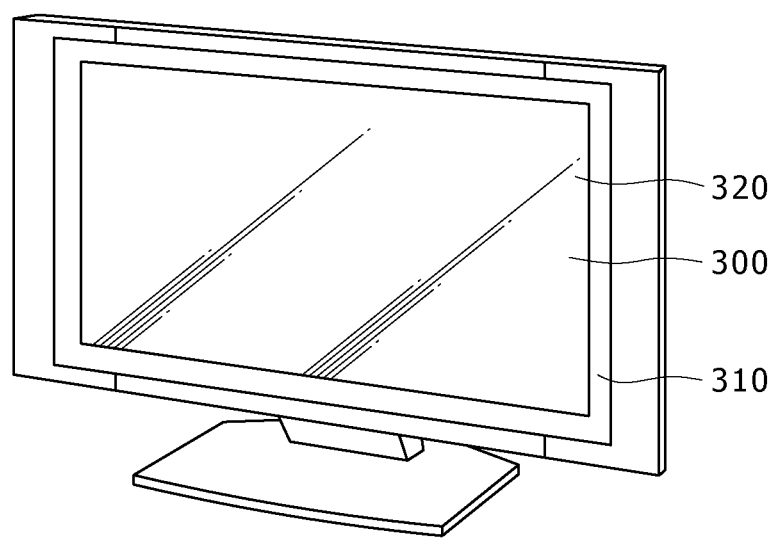
FIG. 15 is a perspective diagram showing the external appearance of a first typical electronic apparatus to which the display apparatus shown in FIG. 12 is applied.

FIG. 15 is a perspective diagram showing the external appearance of a TV set serving as a first typical electronic apparatus to which the display apparatus shown in FIG. 12 is applied. Typically, the TV set has a video display screen section 300 including a front panel 310 and a filter glass 320. The video display screen section 300 corresponds to the display apparatus described before.

Second Typical Electronic Apparatus

Figure 16A:
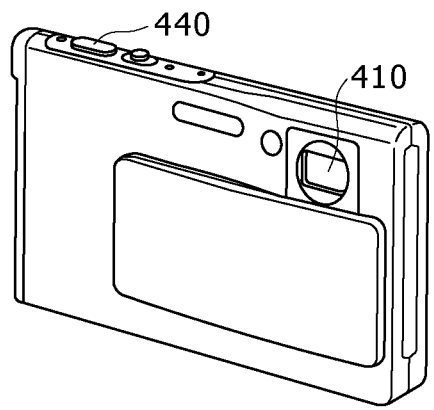
FIG. 16A is a perspective diagram showing the external appearance of a second typical electronic apparatus to which the display apparatus shown in FIG. 12 is applied.
Figure 16B:
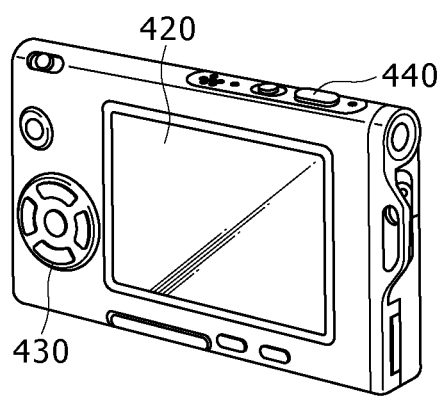
FIG. 16B is a perspective diagram showing the rear view of the second typical electronic apparatus.

FIG. 16A is a perspective diagram showing the external appearance of a digital camera serving as a second typical electronic apparatus to which the display apparatus shown in FIG. 12 is applied. On the other hand, FIG. 16B is a perspective diagram showing the rear view of the second typical electronic apparatus. Typically, the digital camera has a light emitting section 410 for generating flash light, a display section 420, a menu switch 430 and a shutter button 440. The display section 420 corresponds to the display apparatus described before.

Third Typical Electronic Apparatus

Figure 17:
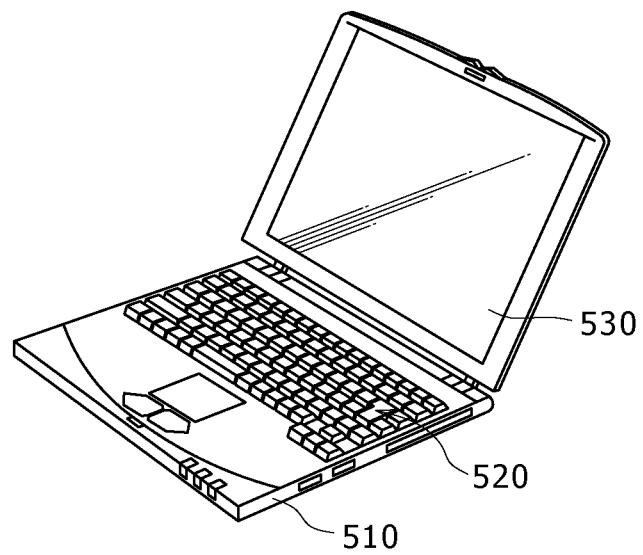
FIG. 17 is a perspective diagram showing the external appearance of a third typical electronic apparatus to which the display apparatus shown in FIG. 12 is applied.

FIG. 17 is a perspective diagram showing the external appearance of a notebook personal computer serving as a third typical electronic apparatus to which the display apparatus shown in FIG. 12 is applied. Typically, the notebook personal computer has a main unit 510, a keyboard 520 and a display section 530 for displaying an image. The keyboard 520 is an input section on which an operation to enter characters and the like is carried out by the user. The display section 530 corresponds to the display apparatus described before.

Fourth Typical Electronic Apparatus

Figure 18:
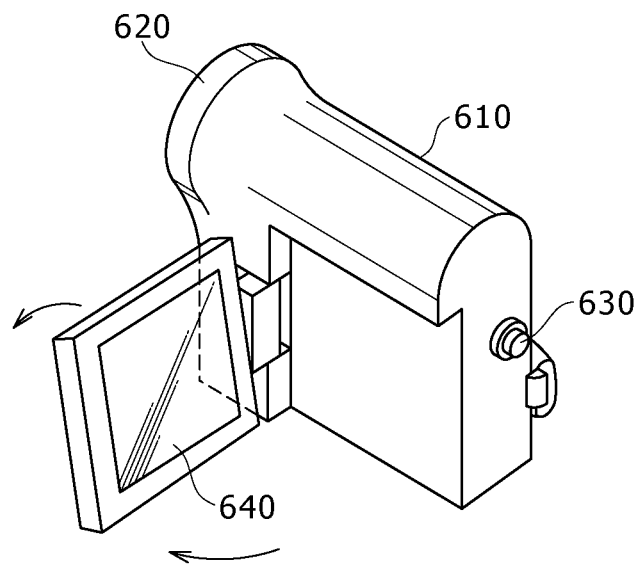
FIG. 18 is a perspective diagram showing the external appearance of a fourth typical electronic apparatus to which the display apparatus shown in FIG. 12 is applied.

FIG. 18 is a perspective diagram showing the external appearance of a video camera serving as a fourth typical electronic apparatus to which the display apparatus shown in FIG. 12 is applied. Typically, the video camera has a main unit 610, a lens 620 for taking an image of an image taking object, a start/stop switch 630 for starting and stopping an image taking operation and a display section 640. The lens 620 is provided on the front-side surface of the main unit 610. The display section 640 corresponds to the display apparatus described before.

Fifth Typical Electronic Apparatus

FIG. 19A is a diagram showing the front view the opened state of a cellular phone serving as a fifth typical electronic apparatus to which the display apparatus shown in FIG. 12 is applied. FIG. 19B is a diagram showing the side view of the opened state of the fifth typical electronic apparatus whereas FIG. 19C is a diagram showing the front view of the closed state of the fifth typical electronic apparatus. FIG. 19D is a diagram showing the left-side view of the closed state of the fifth typical electronic apparatus whereas FIG. 19E is a diagram showing the right-side view of the closed state of the fifth typical electronic apparatus. FIG. 19F is a diagram showing the top view of the closed state of the fifth typical electronic apparatus whereas FIG. 19G is a diagram showing the bottom view of the closed state of the fifth typical electronic apparatus.

Typically, the cellular phone has an upper-side case 710, a lower-side case 720, a hinge 730, a display section 740, a sub-display section 750, a picture light 760 and a camera 770. The hinge 730 is a section for linking the upper-side case 710 and the lower-side case 720 to each other. The display section 740 and/or the sub-display section 750 correspond to the display apparatus described before.

As described above, the present disclosure has been exemplified by taking each of the embodiment and the modified version as a typical implementation. However, implementations of the present disclosure are by no means limited to the embodiment and the modified version. That is to say, a variety of changes can be made to the embodiment and the modified version. For example, in the embodiment, the gate insulation film is implemented as a silicon-oxide film used as a single-layer film. However, the gate insulation film is not necessarily implemented as a single-layer film made from a silicon oxide. For example, as an alternative, the gate insulation film can also be a two-layer film having a structure including a silicon-oxide film and a silicon-nitride film. As another alternative, the gate insulation film can also be a three-layer film having a structure including two silicon-oxide films and a low-density aluminum-oxide film sandwiched between the silicon-oxide films. As a further alternative, the gate insulation film can also be a multi-layer film having a structure including four or more layers.

The present disclosure contains subject matter related to that disclosed in Japanese Priority Patent Application JP 2011-027293 filed in the Japan Patent Office on Feb. 10, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A thin-film transistor comprising:
    a substrate;
    a gate electrode;
    a source electrode and a drain electrode which form a source/drain-electrode pair; and
    a channel layer between said gate electrode and said source/drain-electrode pair,
    wherein,
        said channel layer includes a poly-crystal oxide semiconductor material and has a thickness in a range of 10 nm to 20 nm, inclusive, and
        the poly-crystal oxide semiconductor material has a (222) face parallel to the substrate.

2. The thin-film transistor according to claim 1 wherein said poly-crystal oxide semiconductor material is an $In_2O_3$-group oxide semiconductor.

3. The thin-film transistor according to claim 2 wherein, in said channel layer including said $In_2O_3$-group oxide semiconductor, the (222) face or a (400) face of which matches a carrier propagation direction.

4. The thin-film transistor according to claim 1 wherein the crystal structure of said poly-crystal oxide semiconductor material is the Bixbyite structure.

5. The thin-film transistor according to claim 4 wherein, in said channel layer including said poly-crystal oxide semiconductor adopting said Bixbyite structure, the crystal axis of said crystal grains is oriented in the same direction as the (222) face or a (400) face.

6. The thin-film transistor according to claim 1 wherein said channel layer includes an impurity material.

7. The thin-film transistor according to claim 6 wherein said impurity material is selected from the group consisting of titanium (Ti), aluminum (Al), gallium (Ga), zinc (Zn), tin (Sn), molybdenum (Mo), and a lanthanoid element.

8. A display apparatus comprising:
  a display device and
  a thin-film transistor for driving said display device,
  wherein, said thin-film transistor includes:
    a substrate;
    a gate electrode;
    a source electrode and a drain electrode which form a source/drain-electrode pair;
    a channel layer between said gate electrode and said source/drain-electrode pair, said channel layer includes a poly-crystal oxide semiconductor material and has a film thickness in a range of 10 nm to 20 nm, inclusive, and
  the poly-crystal oxide semiconductor material has a (222) face parallel to the substrate.

9. An electronic apparatus including a display apparatus, said display apparatus comprising:
  a display device and
  a thin-film transistor configured to drive said display device,
  wherein said thin-film transistor includes:
    a substrate,
    a gate electrode,
    a source electrode and a drain electrode which form a source/drain-electrode pair,
    a channel layer between said gate electrode and said source/drain-electrode pair, the channel layer including a poly-crystal oxide semiconductor material and having a thickness in a range of 10 nm to 20 nm, inclusive, and
    the poly-crystal oxide semiconductor material has a (222) face parallel to the substrate.

* * * * *